(12) United States Patent
Kim

(10) Patent No.: US 7,718,499 B2
(45) Date of Patent: May 18, 2010

(54) METHOD OF FABRICATING A SEMICONDUCTOR DEVICE

(75) Inventor: Choong Bae Kim, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 171 days.

(21) Appl. No.: 12/163,625

(22) Filed: Jun. 27, 2008

(65) Prior Publication Data

US 2009/0246960 A1      Oct. 1, 2009

(30) Foreign Application Priority Data

Mar. 27, 2008      (KR) ...................... 10-2008-0028391

(51) Int. Cl.
*H01L 21/00* (2006.01)
(52) U.S. Cl. .................. 438/287; 438/268; 438/279; 438/689; 438/718; 438/722; 257/E21.214; 257/E21.218; 257/E21.423; 257/E21.507; 257/E21.679; 257/E27.103; 257/E29.129; 257/E29.165; 257/E29.302; 257/E29.309
(58) Field of Classification Search ......... 438/257–289, 438/623, 689–723; 257/E21.209–218, 423, 257/507, 679, E27.103, E29.129, 165, 302–309
See application file for complete search history.

(56) References Cited

U.S. PATENT DOCUMENTS

| | | | |
|---|---|---|---|
| 6,529,410 B1 * | 3/2003 | Han et al. ............... | 365/185.17 |
| 6,774,462 B2 * | 8/2004 | Tanaka et al. ............ | 257/639 |
| 6,867,453 B2 * | 3/2005 | Shin et al. .................. | 257/314 |
| 7,067,871 B2 * | 6/2006 | Ozawa ..................... | 257/315 |
| 7,112,834 B1 | 9/2006 | Schwarz et al. | |
| 7,391,075 B2 * | 6/2008 | Jeon et al. ................. | 257/316 |
| 7,436,018 B2 * | 10/2008 | Bhattacharyya ........... | 257/315 |
| 2001/0049195 A1 | 12/2001 | Chooi et al. | |
| 2001/0051439 A1 * | 12/2001 | Khan et al. ................ | 438/710 |
| 2005/0023604 A1 * | 2/2005 | Kim et al. ................. | 257/316 |
| 2006/0252265 A1 * | 11/2006 | Jin et al. ................... | 438/689 |
| 2006/0273404 A1 * | 12/2006 | Scheuerlein .............. | 257/390 |
| 2007/0042601 A1 * | 2/2007 | Wang et al. ............... | 438/689 |

(Continued)

FOREIGN PATENT DOCUMENTS

KR      1019990025239 A      4/1999

(Continued)

*Primary Examiner*—Michael S Lebentritt
(74) *Attorney, Agent, or Firm*—Townsend and Townsend and Crew LLP

(57) ABSTRACT

In a method of fabricating a semiconductor device, an additive gas is mixed with an etching gas to reduce a fluorine ratio of the etching gas. The etching gas having a reduced fluorine rate is utilized in the process for etching a nitride layer formed on an oxide layer to prevent the oxide layer formed below the nitride layer from being etched along with the nitride layer. The method comprises primarily etching an exposed charge storage layer using an etching gas; and secondarily etching the charge storage layer using the etching gas under a condition that a ratio of fluorine contained in the etching gas utilized in the secondary etching step is less than a ratio of fluorine contained in the etching gas utilized in the primary etching step. Thus, the tunnel insulating layer formed below the charge storage layer is not damaged when the charge storage layer is patterned.

30 Claims, 5 Drawing Sheets

U.S. PATENT DOCUMENTS

2008/0121983 A1* 5/2008 Seong et al. ................ 257/324
2009/0152621 A1* 6/2009 Polishchuk et al. ......... 257/325
2009/0176375 A1* 7/2009 Benson et al. .............. 438/719
2009/0294838 A1* 12/2009 Lee et al. .................... 257/326

FOREIGN PATENT DOCUMENTS

KR         100266005 B1      6/2000

* cited by examiner

METHOD OF FABRICATING A
SEMICONDUCTOR DEVICE

CROSS-REFERENCE TO RELATED APPLICATIONS

This application claims priority from Korean Patent Application No. 10-2008-0028391, filed on Mar. 27, 2008, the contents of which are incorporated herein by reference in its entirety.

BACKGROUND OF THE INVENTION

The present invention relates to a method of fabricating a semiconductor device, and more particularly relates to a method of fabricating a semiconductor device which can minimize damage to an oxide layer when a nitride layer formed on the oxide layer is etched.

In semiconductor devices, a non-volatile memory device may include a charge storage layer formed of an insulating layer (for example, a nitride layer) instead of a polysilicon layer which is a conductive layer.

The non-volatile memory device in which the charge storage layer is formed of a conductive layer has a disadvantage that if there is a fine defect on a floating gate, a retention time of charges becomes significantly lowered. However, in the non-volatile memory device in which an insulating layer such as a nitride layer is formed as the charge storage layer, there is an advantage that process defects are relatively reduced due to a property of the nitride layer.

In addition, in the non-volatile memory device in which the charge storage layer is formed of a conductive layer, since a tunnel insulating layer having a thickness of approximately 70 Å or more is formed below a floating gate, there is a limit in realizing a low voltage operation and a high speed operation of the semiconductor device. In the non-volatile memory device in which an insulating layer acts as the charge storage layer, however, it is possible to make a thickness of a direct tunneling insulating layer formed below the charge storage layer become smaller. Thus, the memory device may operate at a low voltage and low power with a high speed.

In general, when the non-volatile memory device in which an insulating layer is utilized as the charge storage layer, an isolation layer is formed on a semiconductor substrate by a shallow trench isolation (STI) process, and an oxide layer as the direct tunneling insulating layer, a nitride layer as the charge storage layer for storing electric charge therein, an oxide layer as the charge blocking layer and a conductive layer as a gate electrode layer are then formed on the semiconductor substrate including the isolation layer. Subsequently, an etching process for forming a gate pattern is performed to form a gate constituting the memory cell.

As described above, however, since the direct tunneling insulating layer has an extremely small thickness, if the exposed direct tunneling insulating layer is etched together with the charge storage layer during an etching process for the charge storage layer, an active region of the semiconductor substrate is directly exposed so that the active region may be damaged. As a result, an operational characteristic of the non-volatile memory device may be adversely affected.

In the process for fabricating the semiconductor device, after forming a gate on a gate insulating layer, a gate spacer can be formed on a side wall of the gate for protecting the gate. In general, an insulating layer, for example, a nitride layer having a thickness sufficient for maintaining a step of the gate, is formed on the semiconductor substrate including the gate. An anisotropic etching process for the nitride layer is then performed to form the gate spacer. However, during the etching process for the nitride layer, the exposed gate insulating layer can be etched together with the nitride layer. In this case, the active region of the semiconductor substrate is also directly exposed so that the active region may be damaged. Due to a damage of the active region, a characteristic of the non-volatile memory device can be lowered.

SUMMARY OF THE INVENTION

In the method of fabricating a semiconductor device according to the present invention, an additive gas is mixed with an etching gas to reduce a fluorine ratio of the etching gas. The etching gas having a reduced fluorine rate is utilized in the process for etching a nitride layer formed on an oxide layer. Thus, it is possible to prevent the oxide layer formed below the nitride layer from being etched along with the nitride layer while etching the nitride layer.

The method of fabricating a semiconductor device according to the present invention comprises the steps of providing a semiconductor substrate on which a tunnel insulating layer and a charge storage layer formed of an insulating material are formed; forming a stack layer on the charge storage layer; patterning the stack layer to expose a portion of the charge storage layer; primarily etching the exposed charge storage layer using a first etching gas; and secondarily etching the charge storage layer using a second etching gas, wherein a ratio of fluorine contained in the second etching gas is less than a ratio of fluorine contained in the first etching gas.

The method of fabricating a semiconductor device according to another aspect of the present invention comprises the steps of providing a semiconductor substrate on which a tunnel insulating layer and a charge storage layer formed of an insulating material are formed; forming a stack layer on the charge storage layer; patterning the stack layer to expose a portion of the charge storage layer; and etching the exposed charge storage layer using an etching gas to which hydrocarbon gas containing a carbon (C) component and a hydrogen (H) component is added as an additive gas.

The charge storage layer can be formed of a nitride layer. The tunnel insulating layer can be formed of an oxide layer. The etching gas can comprise hydrofluorocarbon gas containing carbon (C), hydrogen (H) and fluorine (F) components. The hydrofluorocarbon gas can comprise one of methyl fluoride ($CH_3F$) gas, difluoromethane ($CH_2F_2$) gas, trifluoromethane ($CHF_3$) gas or a mixture gas of at least two thereof. In the secondary etching step, an additive gas can be added to the etching gas to reduce a ratio of fluorine in the etching gas. The additive gas may comprise hydrocarbon gas containing carbon (C) and hydrogen (H) components. The hydrocarbon gas may comprise one of methane ($CH_4$) gas, acetylene ($C_2H_2$) gas, benzene ($C_6H_6$) gas or a mixture gas of at least two thereof. The etching gas can further contain one of argon (Ar) gas, helium (He) gas, xenon (Xe) gas and nitrogen ($N_2$) gas. The etching gas can further contain oxygen ($O_2$) gas.

The method of fabricating a semiconductor device according to another aspect of the present invention comprises the steps of providing a semiconductor substrate on which an oxide layer and a nitride layer are formed; primarily etching the nitride layer using a first etching gas; and secondarily etching the nitride layer using a second etching gas, wherein a ratio of fluorine contained in the second etching gas is less than a ratio of fluorine contained in the first etching gas. The method of fabricating a semiconductor device according to a further aspect of the present invention comprises the steps of providing a semiconductor substrate on which an oxide layer and a nitride layer are formed; and etching the nitride layer using an etching gas to which hydrocarbon gas containing carbon component and hydrogen component is added as an additive gas.

The etching gas can comprise hydrofluorocarbon gas containing carbon (C), hydrogen (H) and fluorine (F) components. The hydrofluorocarbon gas can comprise one of methyl fluoride ($CH_3F$) gas, difluoromethane ($CH_2F_2$) gas, trifluoromethane ($CHF_3$) gas or a mixture gas of at least two thereof. In the secondary etching step, an additive gas can be added to the etching gas to reduce a ratio of fluorine in the etching gas. The additive gas can comprise hydrocarbon gas containing carbon (C) and hydrogen (H) components. The hydrocarbon gas can comprise one of methane ($CH_4$) gas, acetylene ($C_2H_2$) gas, benzene ($C_6H_6$) gas or a mixture gas of at least two thereof.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Figure 1A:
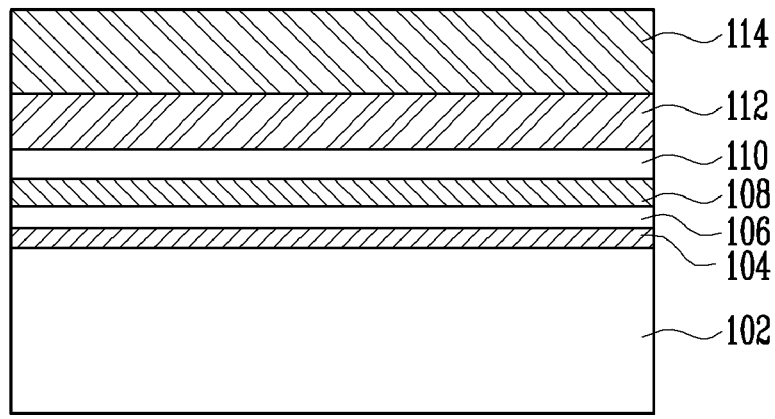
FIG. 1A to FIG. 1F are sectional views of a semiconductor device for illustrating a method of fabricating a semiconductor device according to one embodiment of the present invention.

Hereinafter, the preferred embodiments of the present invention will be explained in detail with reference to the accompanying drawings.

However, the present invention is not limited to the embodiment described below. It should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art. In addition, in the detailed description, the expression of "a certain layer is formed on another layer or a semiconductor substrate" means that the certain layer can be formed directly on another layer or the semiconductor substrate and that a third layer can be disposed between the certain layer and another layer or the semiconductor substrate. A thickness or a dimension of a respective layer shown in the drawings may be illustrated out of scale for convenience and clarity of explanation.

FIG. 1A to FIG. 1F are sectional views of a semiconductor device illustrating a method of fabricating a semiconductor device according to one embodiment of the present invention.

Figure 2:
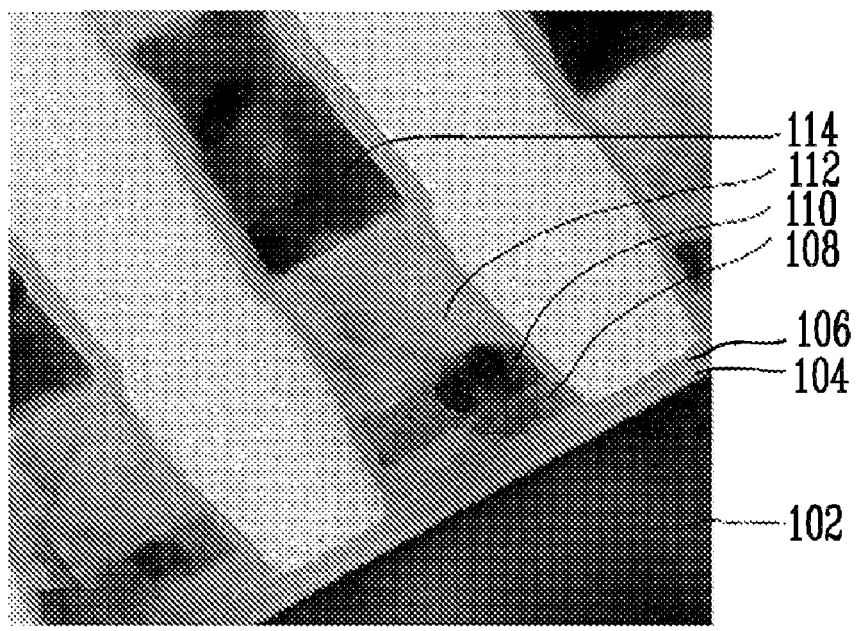
FIG. 2 is a photograph of a section of a semiconductor and shows that an etching process is performed up to a charge blocking layer according to one embodiment of the present invention.
Figure 3:
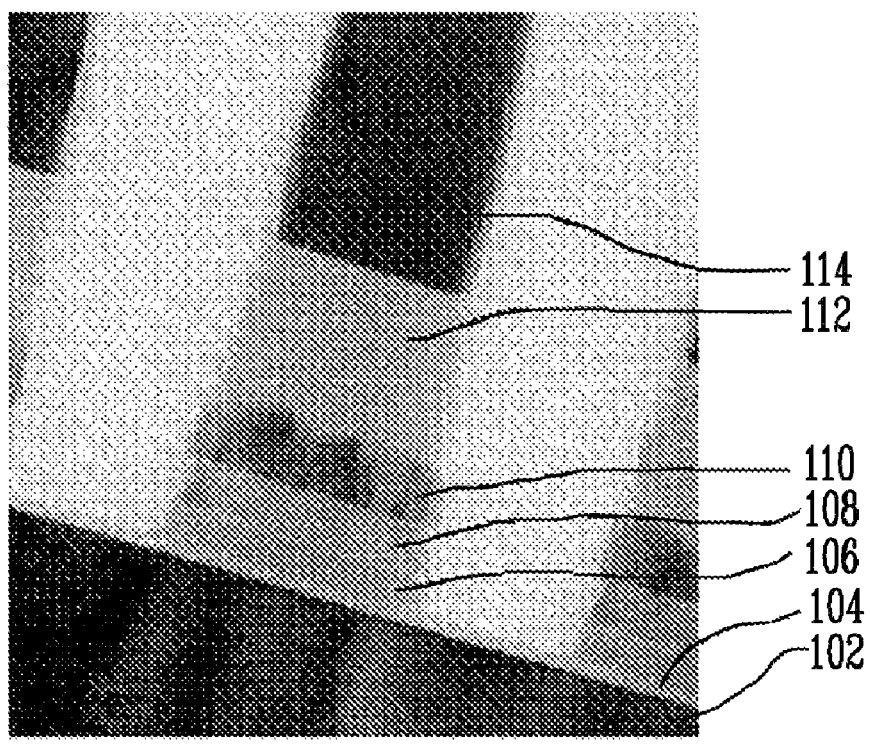
FIG. 3 is a photograph of a section of a semiconductor and shows that an etching is performed up to a charge storage layer according to one embodiment of the present invention.

FIG. 2 is a photograph of a section of a semiconductor and shows that an etching is performed up to a charge blocking layer according to one embodiment of the present invention. FIG. 3 is a photograph of a section of a semiconductor and shows that an etching is performed up to a charge storage layer according to one embodiment of the present invention.

Referring to FIG. 1A, a screen oxide layer (not shown) is formed on a semiconductor substrate 102. In order to fabricate a non-volatile memory device in the semiconductor device, a well ion implanting process is performed on the semiconductor substrate 102 to form a well region (not shown). The well region may have a triple structure. Subsequently, a threshold voltage ion implanting process is performed on the semiconductor substrate 102 to adjust a threshold voltage of the non-volatile memory device. The screen oxide layer (not shown) can prevent damage to a surface of the semiconductor substrate 102 when the well ion implanting process or the threshold voltage ion implanting process is carried out.

The screen oxide layer (not shown) is removed, and a trench (not shown) is then formed on an isolation region of the semiconductor substrate 102. The trench (not shown) is filled with insulative material to form an isolation layer (not shown). The isolation layer (not shown) defines an active region.

Subsequently, a tunnel insulating layer 104 is formed on the semiconductor substrate 102. Since electric charges may pass through the tunnel insulating layer 104 through a direct tunnel phenomenon, the electric charges below the tunnel insulating layer 104 may pass through the tunnel insulating layer 104 and may then be transported to a charge storage layer formed above the tunnel insulating layer 104 during a program operation. The electric charges stored in the charge storage layer may be transported to a location below the tunnel insulating layer 104 through the tunnel insulating layer 104 during an erase operation. The tunnel insulating layer 104 may be formed of an oxide layer with a thickness of approximately 40 Å.

A charge storage layer 106 is formed on the tunnel insulating layer 104. The charge storage layer 106 is formed on the overall semiconductor substrate 102 including a plurality of active regions. The charge storage layer 106 may be formed of insulative material, for example, nitride. If the charge storage layer 106 is formed of insulative material, it is possible to form the charge storage layer 106 having a thickness smaller than that of the charge storage layer formed of conductive material. Thus, a size of the non-volatile memory device can be reduced and a retention characteristic can be improved to improve performance of the non-volatile memory device.

A charge blocking layer 108 is formed on the charge storage layer 106. The charge blocking layer 108 may prevent the electric charges stored in the charge storage layer 106 from being discharged to a layer formed on the charge storage layer 106 by a reverse-tunneling effect. The charge blocking layer 108 may be formed of insulative material with a high dielectric ratio, for example, aluminum oxide ($Al_2O_3$), and formed with a thickness of approximately 150 Å.

A plurality of gate electrode layers, for example, a first gate electrode layer 110, a second gate electrode layer 112 and a third gate electrode layer 114, are formed on the charge blocking layer 108. The first gate electrode layer 110 may be formed of conductive material, for example, titanium nitride (TiN), with a thickness of approximately 200 Å. The second gate electrode layer 112 may be formed of conductive material, for example, polysilicon, with a thickness of approximately 500 Å. The third gate electrode layer 114 may be formed of conductive material, for example, tungsten silicide (WSi$_x$), with a thickness of approximately 1,100 Å.

Figure 1B:
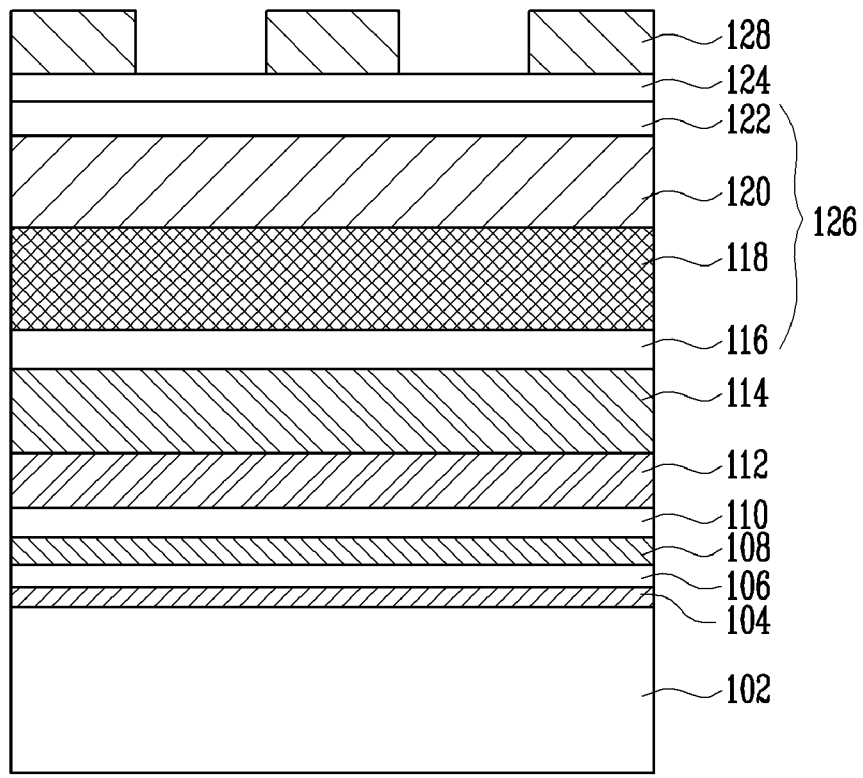

Referring to FIG. 1B, a hard mask 126 in which a plurality of layers are laminated, is formed on the third gate electrode layer 114. The hard mask 126 is used in a subsequent process for etching a gate. To form the hard mask 126, a capping layer 116 is formed first on the third gate electrode layer 114. The capping layer 116 can be formed of silicon oxynitride (SiON) with a thickness of approximately 200 Å. A first hard mask layer 118 and a second hard mask layer 120 are formed on the capping layer 116. The first hard mask layer 118 may be formed of oxide, for example, tetra ethyl ortho silicate (TEOS), with a thickness of approximately 1,400 Å. The second hard mask layer 120 may be formed of carbon, for example, amorphous carbon, with a thickness of approximately 2,000 Å. A protective layer 122 may be formed on the second hard mask layer 200. The protective layer 122 prevents the second hard mask layer 120 from being damaged in a subsequent process and can act as an anti-reflection layer. The protective layer 122 may be formed of silicon oxynitride (SiON), with a thickness of approximately 400 Å. As a result, the hard mask 126 is formed comprising the capping layer 116, the first hard mask layer 118, the second hard mask layer 120 and the protective layer 122.

An anti-reflection layer 124 is formed on the protective layer 122. A diffused reflection can be prevented in a subsequent exposure process by the anti-reflection layer 124 to increase resolution in the exposure process. The anti-reflection layer can be formed with a thickness of approximately 240 Å. Subsequently, a photoresist layer is formed on the anti-reflection layer 214, and an exposure process and a developing process are performed for the photoresist layer to form a photoresist pattern 128.

Figure 1C:
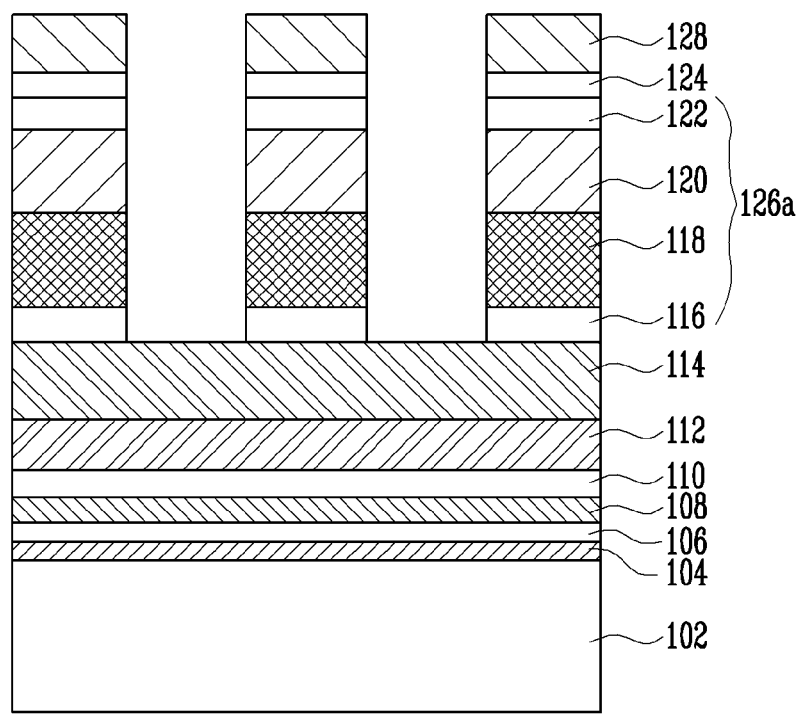

Referring to FIG. 1C, the anti-reflection layer 124, the protective layer 122, the second hard mask layer 120, the first hard mask layer 118 and the capping layer 116 are etched and patterned through an etching process in which the photoresist pattern 128 is utilized as an etching mask. Thus, a hard mask pattern 126a is formed. In order to form the hard mask pattern 126a, the etching process is performed under etching conditions which are suitable for the etching-target layers constituting the hard mask pattern 126a. During the etching process performed for forming the hard mask pattern 126a, a cleaning process can be additionally performed for removing impurities generated during the etching process.

Figure 1D:
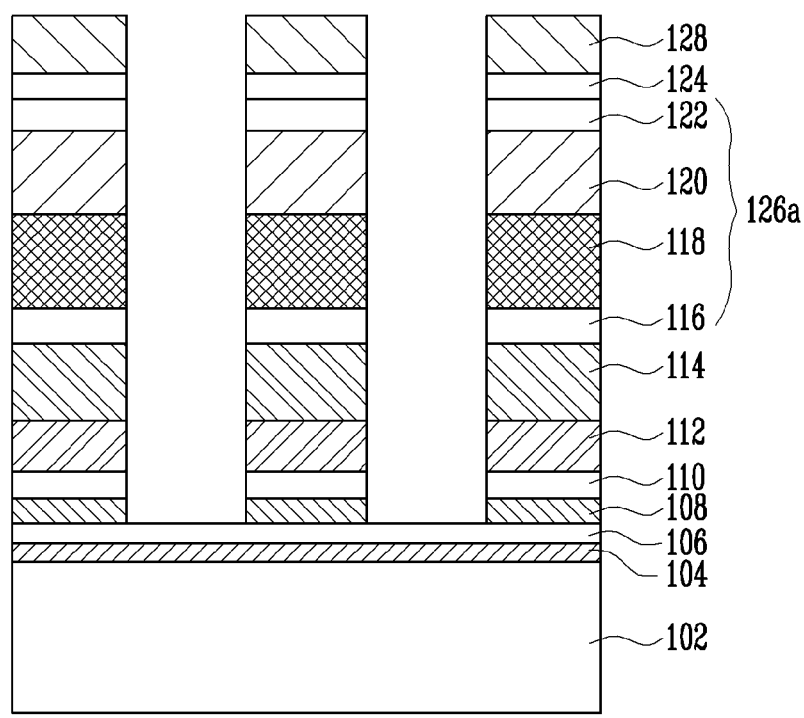

Referring to FIG. 1D and FIG. 2 the third gate electrode layer 114, the second gate electrode layer 112, the first gate electrode layer 110 and the charge blocking layer 108 are etched and patterned through an etching process in which the hard mask pattern 126 is used as the etching mask. As a result, the charge storage layer 106 formed below the charge blocking layer 108 is exposed. The etching process is performed under etching conditions which are suitable for the respective etching-target layers.

Figure 1E:
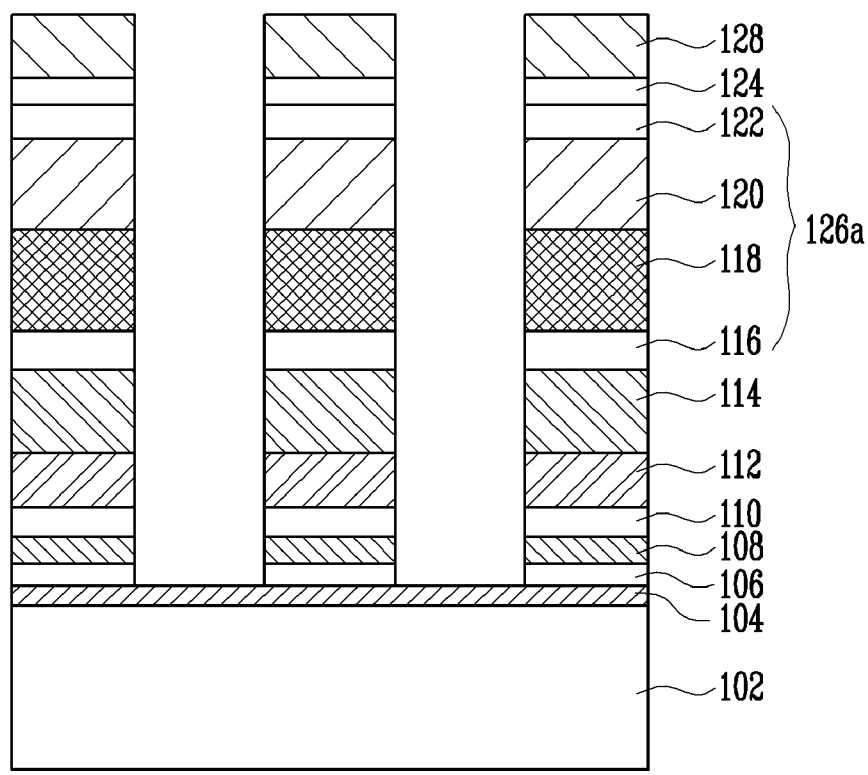

Referring to FIG. 1E and FIG. 3, an etching process for the exposed charge storage layer 106 is performed. The etching process is performed under the condition by which the tunnel insulating layer 104 is less etched than the charge storage layer 106, for example, the oxide layer is less etched than the nitride layer, so as to prevent the tunnel insulating layer 104 formed below the charge storage layer 106 from being damaged.

To achieve the above result, the etching process for the charge storage layer 106 is performed using a mixture gas of an etching gas containing fluorine and an additive gas capable of reducing a ratio of fluorine contained in the etching gas. As an etching gas containing fluorine, hydrofluorocarbon gas containing carbon (C), hydrogen (H) and fluorine (F) components, for example, one of methyl fluoride (CH$_3$F) gas, difluoromethane (CH$_2$F$_2$) gas, trifluoromethane (CHF$_3$) gas or a mixture gas thereof may be utilized. In addition, as an additive gas, hydrocarbon gas containing carbon (C) and hydrogen (H) components, for example, any one of methane (CH$_4$) gas, acetylene (C$_2$H$_2$) gas, benzene (C$_6$H$_6$) gas or a mixture gas thereof may be utilized. Furthermore, oxygen (O$_2$) gas is further added to the etching gas to increase an etching selection ratio of the tunnel insulating layer 104 formed of the oxide layer. Thus, an amount of the tunnel insulating layer 104 to be etched can be further reduced to prevent the tunnel insulating layer 104 from being damaged.

In order to etch the exposed charge storage layer 106, an additive gas is mixed with the etching gas. The etching process is then performed using a mixture of the etching gas and the additive gas. After a conventional etching process for the charge storage layer 106 is performed using the etching gas, the additive gas can be mixed with the etching gas. The etching process can be performed using the mixture of the etching gas and the additive gas before the tunnel oxide layer 104 is exposed. The latter further reduces a process time for etching the charge storage layer 106 and may prevent the tunnel insulating layer 104 from being damaged.

In addition, one of argon (Ar) gas, helium (He) gas, xenon (Xe) gas, nitrogen (N$_2$) gas or a mixture gas of at least two thereof is additionally mixed with the etching gas. The above etching process is performed using the mixed etching gas. Thus, the charge storage layer 106 formed of a nitride layer can be etched more easily and it is possible to form the gate profile vertically.

In the above process for etching the charge storage layer 106, a relatively low bias power, for example, a bias power of 20 to 200 W, is applied so that damage to the tunnel insulating layer 104 can be prevented more effectively. In addition, during the etching process, upper portions of the photoresist pattern 128 and the hard mask 126 may be removed partially.

As described above, the gate of the semiconductor device according to the present invention prevents the tunnel insulating layer 104 from being damaged and the charge storage layer 106 can be formed separately on each active region. As compared with a technology for forming the charge storage layer on an overall semiconductor substrate, accordingly, the present invention can solve the problem that charges stored in the charge storage layer 106 are transported to the adjacent memory cell to lower a retention characteristic.

In order to prevent a side surface of the gate, which is etched during a gate etching process, from being damaged, a nitride layer acting as a protective layer (not shown) is formed on the side surface of the gate. The protective layer (not shown) and the exposed charge storage layer 106 may then be etched together.

Figure 1F:
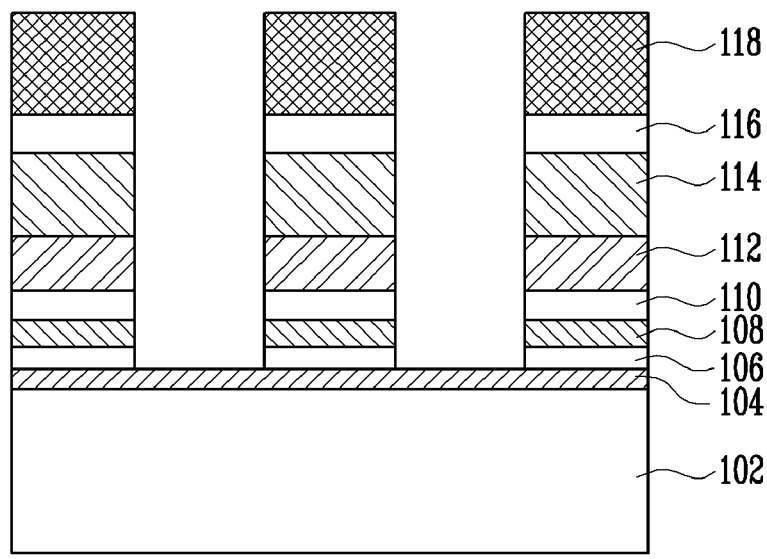

Referring to FIG. 1F, the remaining photoresist pattern 128 (see FIG. 1E), anti-reflection layer 124 (see FIG. 1E), protective layer 122 (see FIG. 1E) and second hard mask layer 120 (see FIG. 1E) are removed to complete a formation of the gate of the non-volatile memory device.

Figure 4A:
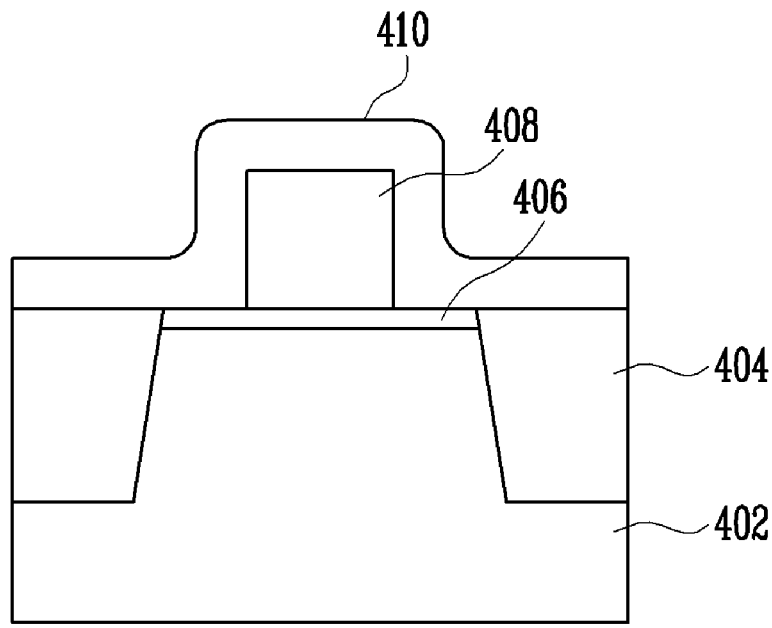
FIG. 4A and FIG. 4B are sectional views of a semiconductor device for illustrating a method of a fabricating a semiconductor device according to another embodiment of the present invention.
Figure 4B:
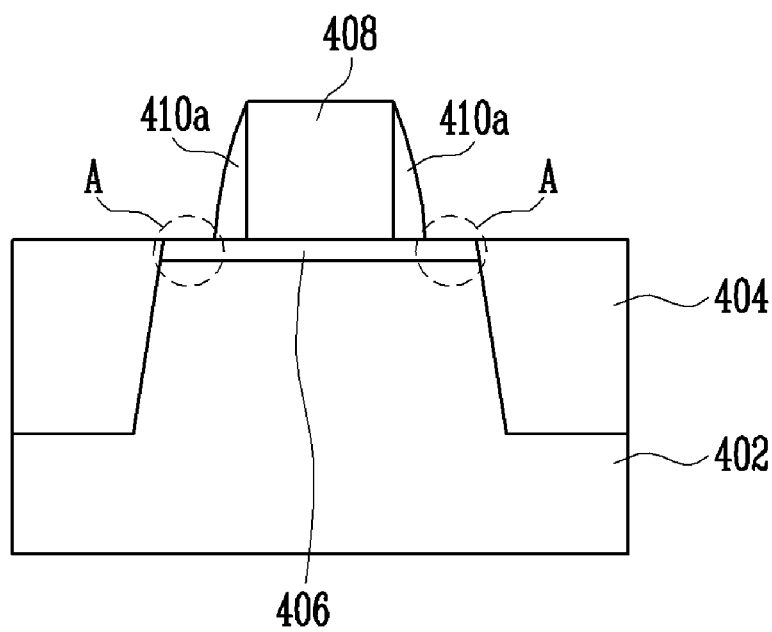

FIG. 4A and FIG. 4B are sectional views of a semiconductor device for illustrating a method of a fabricating a semiconductor device according to another embodiment of the present invention.

FIG. 4A, an isolation layer 404 is formed on an isolation region of a semiconductor substrate 402 to define an active region of the semiconductor substrate 402. A gate insulating layer 406 is formed on the active region of the semiconductor substrate 402. The gate insulating layer 406 may be formed of an insulating layer, for example, an oxide layer. In addition, a gate 408 is formed on the gate insulating layer 406. Material used for forming a spacer is applied on the semiconductor substrate 402 including the gate 408 to form a spacer-material layer 410 on an upper face and side walls of the gate 408.

It is desirable that the spacer-material layer 410 is formed with a thickness sufficient for maintaining a step caused by the gate 408. The spacer-material layer 410 may be formed of an insulating layer, for example, a nitride layer.

Referring to FIG. 4B, a process for etching the spacer-material layer 410 is performed to allow the spacer-material layer 410 to remain on side surfaces of the gate 408. Preferably, an anisotropic etching process is performed as the etching process for the spacer-material layer 410.

While the spacer-material layer 410 formed on the gate insulating layer 406 is removed, the gate insulating layer 406 on a region A may be exposed during the etching process. Accordingly, it is preferable that the etching process for forming a spacer 410a is performed under the condition by which the gate insulating layer 406 is less etched than the spacer-material layer 410, for example, the oxide layer is less etched than the nitride layer, so as to prevent the gate insulating layer 406 formed on the region A from being damaged by the etching gas.

To achieve the above result, it is preferable that the etching process for the spacer-material layer 410 is performed using a mixture gas of an etching gas containing fluorine and an additive gas capable of reducing a ratio of fluorine contained in the etching gas. As an etching gas containing fluorine, hydrofluorocarbon gas containing carbon (C), hydrogen (H) and fluorine (F) components, for example, any one of methyl fluoride ($CH_3F$) gas, difluoromethane ($CH_2F_2$) gas, trifluoromethane ($CHF_3$) gas or a mixture gas thereof may be utilized. In addition, as an additive gas, hydrocarbon gas containing carbon (C) and hydrogen (H) components, for example, one of methane ($CH_4$) gas, acetylene ($C_2H_2$) gas, benzene ($C_6H_6$) gas or a mixture gas thereof may be utilized. Furthermore, oxygen ($O_2$) gas is further added to the above etching gas to increase an etching selection ratio of the gate insulating layer 406 formed of the oxide layer. Thus, an amount of the gate insulating layer 406 to be etched may be further reduced to prevent the gate insulating layer 406 from being damaged. In addition, in the etching process for the charge storage layer 106, a relatively low bias power, for example, a bias power of 20 to 200 W, is applied so that damage to the gate insulating layer 406 can be prevented more effectively.

In order to etch the spacer-material layer 410, an additive gas is mixed with the etching gas and the etching process is then performed using a mixture of the etching gas and the additive gas. After a conventional etching process for the spacer-material layer 410 is performed using the etching gas, the additive gas may be mixed with the etching gas and the etching process can be performed using the mixture of the etching gas and the additive gas before the gate insulating layer 406 is exposed. The latter further reduces a process time for etching the spacer-material layer 410 and can prevent the gate insulating layer 406 from being damaged.

In addition, one of argon (Ar) gas, helium (He) gas, xenon (Xe) gas, nitrogen ($N_2$) gas or a mixture gas of at least two thereof, is additionally mixed with the etching gas. The etching process is performed using the mixed etching gas. Thus, the spacer-material layer 410 formed of a nitride layer can be etched more easily, and it is possible to form the gate profile vertically.

According to the method of fabricating the semiconductor device as described above, it is possible to prevent the exposed gate insulating layer 406 from being damaged when the etching process for forming the gate spacer 410a is performed. Accordingly, the present invention can solve the problem that the operational characteristic of the semiconductor becomes adversely affected.

Furthermore, the method of fabricating the semiconductor device in accordance with embodiments of the present invention can prevent damage to the gate insulating layer during the etching process for forming the spacer formed of a nitride layer on the gate insulating layer formed of an oxide layer.

Although the method of fabricating the semiconductor device is illustrated herein as one embodiment, the present invention is not limited thereto. In other words, it will be apparent that the present invention can be applied to all semiconductor fabricating processes which can prevent damage to the exposed oxide layer that is exposed when the nitride layer of the semiconductor substrate on which the oxide layer and the nitride layer are formed is etched.

According to the method of fabricating the semiconductor device of the present invention, since the etching process is performed in a state where a fluorine ratio in an etching gas used for etching the charge storage layer is reduced, it is possible to prevent a direct tunneling insulating layer formed below the charge storage layer from being removed together with the charge storage layer when the charge storage layer is patterned. Accordingly, the present invention can prevent an exposure of the active region below the direct tunneling insulating layer during the etching process to prevent the operational characteristic of the semiconductor device from being adversely affected.

In the method of the present invention, since the charge storage layer is easily patterned so that the charge storage layer can be formed separately on each active region. Accordingly, the present invention can solve problems such as a potential drop caused by transportation of charges stored in the charge storage layer to the adjacent memory cell, a variation of the threshold voltage, a lowering of data retention characteristic, etc.

In addition, the present invention can prevent damage to the gate insulating layer which is exposed when the gate spacer is formed by etching the nitride layer. Thus, it is possible to prevent an operational characteristic of the semiconductor device from being adversely affected.

What is claimed is:

1. A method of fabricating a semiconductor device, the method comprising:
   providing a semiconductor substrate on which a tunnel insulating layer and a charge storage layer formed of an insulating material are formed;
   forming a stack layer over the charge storage layer;
   patterning the stack layer to expose a portion of the charge storage layer;
   primarily etching the exposed charge storage layer using a first etching gas; and
   secondarily etching the charge storage layer using a second etching gas, wherein a ratio of fluorine contained in the second etching gas is less than a ratio of fluorine contained in the first etching gas.

2. The method of claim 1, wherein the charge storage layer is formed of a nitride layer.

3. The method of claim 1, wherein the tunnel insulating layer is formed of an oxide layer.

4. The method of claim 1, wherein the first etching gas and the second etching gas comprise hydrofluorocarbon gas containing carbon (C), hydrogen (H) and fluorine (F) components.

5. The method of claim 4, wherein the hydrofluorocarbon gas comprises one of methyl fluoride ($CH_3F$) gas, difluoromethane ($CH_2F_2$) gas, trifluoromethane ($CHF_3$) gas and a mixture gas of at least two thereof.

6. The method of claim 1, wherein, in the secondary etching step, an additive gas is added to the second etching gas to reduce a ratio of fluorine in the second etching gas.

7. The method of claim 6, wherein the additive gas comprises hydrocarbon gas containing carbon (C) and hydrogen (H) components.

8. The method of claim 7, wherein the hydrocarbon gas comprises one of methane ($CH_4$) gas, acetylene ($C_2H_2$) gas, benzene ($C_6H_6$) gas and a mixture gas of at least two thereof.

9. The method of claim 1, wherein the first etching gas and the second etching gas further comprise one of argon (Ar) gas, helium (He) gas, xenon (Xe) gas and nitrogen ($N_2$) gas.

10. The method of claim 1, wherein the first etching gas and the second etching gas further comprise oxygen ($O_2$) gas.

11. The method of claim 1, wherein the stack layer comprises a charge blocking layer, a gate electrode layer and a hard mask.

12. A method of fabricating a semiconductor device, the method comprising:
providing a semiconductor substrate on which a tunnel insulating layer and a charge storage layer formed of insulating material are formed;
forming a stack layer over the charge storage;
patterning the stack layer to expose a portion of the charge storage layer; and
etching the exposed charge storage layer using an etching gas to which hydrocarbon gas containing a carbon (C) component and a hydrogen (H) component is added as an additive gas.

13. The method of claim 12, wherein the charge storage layer is formed of a nitride layer.

14. The method of claim 12, wherein the tunnel insulating layer is formed of an oxide layer.

15. The method of claim 12, wherein the etching gas comprises hydrofluorocarbon gas containing carbon (C), hydrogen (H) and fluorine (F) components.

16. The method of claim 15, wherein the hydrofluorocarbon gas comprises one of methyl fluoride ($CH_3F$) gas, difluoromethane ($CH_2F_2$) gas, trifluoromethane ($CHF_3$) gas and a mixture gas of at least two thereof.

17. The method of claim 12, wherein the hydrocarbon gas comprises one of methane ($CH_4$) gas, acetylene ($C_2H_2$) gas, benzene ($C_6H_6$) gas and a mixture gas of at least two thereof.

18. The method of claim 12, wherein the etching gas further comprises one of argon (Ar) gas, helium (He) gas, xenon (Xe) gas and nitrogen ($N_2$) gas.

19. The method of claim 12, wherein the etching gas further contains oxygen ($O_2$) gas.

20. The method of claim 12, wherein the stack layer comprises a charge blocking layer, a gate electrode layer and a hard mask.

21. A method of fabricating a semiconductor device, the method comprising:
providing a semiconductor substrate on which an oxide layer and a nitride layer are formed;
primarily etching the nitride layer using a first etching gas; and
secondarily etching the nitride layer using a second etching gas, wherein a ratio of fluorine contained in the second etching gas is less than a ratio of fluorine contained in the first etching gas.

22. The method of claim 21, wherein the etching gas comprises hydrofluorocarbon gas containing carbon (C), hydrogen (H) and fluorine (F) components.

23. The method of claim 22, wherein the hydrofluorocarbon gas comprises one of methyl fluoride ($CH_3F$) gas, difluoromethane ($CH_2F_2$) gas, trifluoromethane ($CHF_3$) gas and a mixture gas of at least two thereof.

24. The method of claim 21, wherein, in the secondary etching step, an additive gas is added to the second etching gas to reduce a ratio of fluorine in the second etching gas.

25. The method of claim 24, wherein the additive gas comprises hydrocarbon gas containing carbon (C) and hydrogen (H) components.

26. The method of claim 25, wherein the hydrocarbon gas comprises one of methane ($CH_4$) gas, acetylene ($C_2H_2$) gas, benzene ($C_6H_6$) gas and a mixture gas of at least two thereof.

27. A method of fabricating a semiconductor device, the method comprising:
providing a semiconductor substrate on which an oxide layer and a nitride layer are formed; and
etching the nitride layer using an etching gas to which hydrocarbon gas containing a carbon component and a hydrogen component is added as an additive gas.

28. The method of claim 27, wherein the etching gas comprises hydrofluorocarbon gas containing carbon (C), hydrogen (H) and fluorine (F) components.

29. The method of claim 28, wherein the hydrofluorocarbon gas comprises one of methyl fluoride ($CH_3F$) gas, difluoromethane ($CH_2F_2$) gas, trifluoromethane ($CHF_3$) gas and a mixture gas of at least two thereof.

30. The method of claim 27, wherein the hydrocarbon gas comprises one of methane ($CH_4$) gas, acetylene ($C_2H_2$) gas, benzene ($C_6H_6$) gas and a mixture gas of at least two thereof.

* * * * *